(12) United States Patent
Lee et al.

(10) Patent No.: US 7,022,458 B2
(45) Date of Patent: Apr. 4, 2006

(54) PHOTORESIST POLYMER AND PHOTORESIST COMPOSITION CONTAINING THE SAME

(75) Inventors: Geun Su Lee, Gyeonggi-do (KR); Cheol Kyu Bok, Seoul (KR); Seung Chan Moon, Gyeonggi-do (KR); Ki Soo Shin, Gyeonggi-do (KR); Jae Hyun Kim, Gyeonggi-do (KR); Jung Woo Kim, Gyeonggi-do (KR); Sang Hyang Lee, Gyeonggi-do (KR); Jae Hyun Kang, Gyeonggi-do (KR)

(73) Assignees: Hynix Semiconductor Inc., Gyeonggi-Do (KR); Dongjin Semichem Co., Ltd., Incheon (KR)

( * ) Notice: Subject to any disclaimer, the term of this patent is extended or adjusted under 35 U.S.C. 154(b) by 69 days.

(21) Appl. No.: 10/719,905

(22) Filed: Nov. 21, 2003

(65) Prior Publication Data

US 2005/0026070 A1    Feb. 3, 2005

(30) Foreign Application Priority Data

Jul. 29, 2003   (KR) .................. 10-20030052337

(51) Int. Cl.
  *G03F 7/004*   (2006.01)
  *C08F 10/00*   (2006.01)
(52) U.S. Cl. .............. 430/270.1; 430/326; 430/907; 526/242; 526/271; 526/281
(58) Field of Classification Search ........... 430/270.1, 430/326, 907, 910; 526/281, 242
  See application file for complete search history.

(56) References Cited

U.S. PATENT DOCUMENTS 6,403,281 B1*  6/2002  Lee et al. ............... 430/270.1
6,461,789 B1* 10/2002  Hatakeyama et al. .... 430/270.1
2002/0146638 A1* 10/2002  Ito et al. ................. 430/270.1
2003/0068573 A1*  4/2003  Takata et al. ............ 430/270.1

\* cited by examiner

*Primary Examiner*—Rosemary Ashton
(74) *Attorney, Agent, or Firm*—Marshall, Gerstein & Borun LLP (57) ABSTRACT

Photoresist polymers and photoresist compositions are disclosed. A photoresist polymer represented by Formula 1 and a photoresist composition containing the same have excellent etching resistance, thermal resistance and adhesive property, and high affinity to an developing solution, thereby improving LER (line edge roughness).

Formula 1

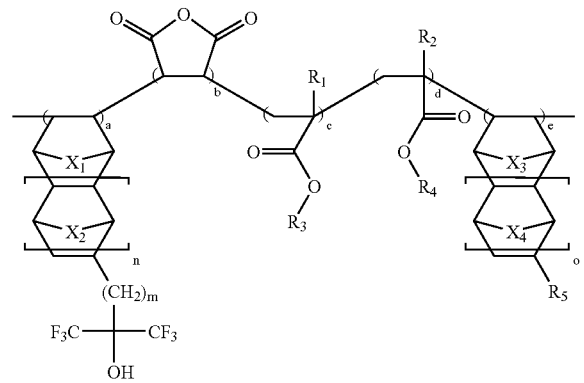

wherein
$X_1$, $X_2$, $X_3$, $R_1$, $R_2$, $R_3$, $R_4$, $R_5$, m, n, o, a, b, c, d and e are as defined in the description.

20 Claims, 7 Drawing Sheets

PHOTORESIST POLYMER AND PHOTORESIST COMPOSITION CONTAINING THE SAME

BACKGROUND

1. Technical Field

Photoresist polymers and photoresist compositions containing the same are disclosed. More specifically, photoresist polymers and photoresist compositions containing the same are disclosed that may improve line edge roughness (hereinafter, referred to as "LER") in a photoresist process using light sources of far ultraviolet regions of 193 nm and 157 nm.

2. Description of the Related Art

In order to be used for ArF and VUV (vacuum ultraviolet) resists, photoresist polymers and photoresist compositions are required to have low light absorbance at wavelengths of 193 mm and 157 nm, excellent etching resistance and adhesive property on the substrate, and to be developed with TMAH solution of 2.38 wt % and 2.6 wt %.

Recently, much research has been conducted on resins having a high transparency at 248 nm and 193 nm wavelengths and dry etching resistance similar to novolac resin.

Since the thickness of resist materials becomes thinner as circuits of semiconductor devices become more microscopic, improvement of LER of patterns has been promptly required.

The LER occurs more frequently in ArF resist patterns than in conventional KrF or i-line resist patterns. The conventional KrF or i-line resist materials include acidic alcohol groups while most ArF resist materials do not include acidic alcohol group. As a result, since the ArF resist materials have low affinity to basic developing solutions, the LER occurs more frequently in the ArF resist materials.

This phenomenon occurs more severely when patterns are formed using chemically amplified photoresist. The LER degrades stability and yield of semiconductor devices for performing a subsequent process.

SUMMARY OF THE DISCLOSURE

Photoresist polymers and photoresist compositions containing the same that have high affinity to developing solution are disclosed.

A method for forming photoresist patterns using the disclosed compositions is disclosed.

DETAILED DESCRIPTION OF THE PRESENTLY PREFERRED EMBODIMENTS

Photoresist polymers including acidic alcohol groups and photoresist compositions containing the same are disclosed.

A photoresist polymer comprises having repeating unit represented by Formula 1:

Formula 1 wherein $X_1$, $X_2$, $X_3$ and $X_4$ individually are selected from the group consisting of $CH_2$, $CH_2CH_2$, O and S;

$R_1$ and $R_2$ individually are selected from the group consisting of H, $CH_3$ and $CF_3$;

$R_3$ is selected from the group consisting of acid labile protecting group, $C_1$–$C_{20}$ alkyl and $C_1$–$C_{20}$ cycloalkyl;

$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether group, $C_5$–$C_{10}$ alkyl including an ester group, $C_5$–$C_{10}$ cycloalkyl including an ether group and $C_5$–$C_{10}$ cycloalkyl including an ester group;

$R_5$ is selected from the group consisting of H, $C_1$–$C_{20}$ alkyl, $C_1$–$C_{20}$ alkyl carboxylate and —O—$R_7$, wherein $R_7$ is $C_1$–$C_{20}$ cycloalkyl;

m is an integer ranging from 0 to 2;

n is an integer of 0 or 1; and the relative ratio of a:b:c:d:e is in the range 1~20 mol %:1~20 mol %:10~60 mol %:1~40 mol %:0~30 mol %.

The disclosed polymers including acidic alcohol groups have high affinity to basic developing solutions. In addition, since the disclosed polymers include fluorine atoms, absorbance of conventional hybrid-type photoresist may be improved.

The acid labile protecting group which may be left by acid determines solution to an alkaline developing solution. That is, the acid labile protecting group prevents the compound from dissolving in the alkaline developing solution. If the acid labile protecting group is left by acid generated by exposure to light, the photoresist may be dissolved in the developing solution. Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methyl ethyl, 1-ethoxypropyl, 1-ethoxy-1-methyl ethyl, 1-methoxyethyl, 1-ethoxyethyl, t-butoxyethyl, and 1-isobutoxyethyl and 2-acetylment-1-yl.

Preferably, the polymer comprises repeating unit of Formula 1a:

Formula 1a wherein $R_1$ and $R_2$ individually are selected from the group consisting of H, $CH_3$ and $CF_3$;

$R_3$ is selected from the group consisting of acid labile protecting group, $C_1$–$C_{20}$ alkyl and $C_1$–$C_{20}$ cycloalkyl;

$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether group, $C_5$–$C_{10}$ alkyl including an ester group, $C_5$–$C_{10}$ cycloalkyl including an ether group and $C_5$–$C_{10}$ cycloalkyl including an ester group;

$R_5$ is selected from the group consisting of H, $C_1$–$C_{20}$ alkyl, $C_1$–$C_{20}$ alkyl carboxylate and —O—$R_7$, wherein $R_7$ is $C_1$–$C_{20}$ cycloalkyl;

m is an integer ranging from 0 to 2;

n is an integer of 0 or 1; and the relative ratio of a:b:c:d:e is in the range 1~20 mol %:1~20 mol %:10~60 mol %:1~40 mol %:0~30 mol %.

More preferably, the polymer having repeating unit of Formula 1a is selected from the group consisting of Formulas 1b to 1h;

Formula 1b

-continued

Formula 1c

Formula 1d

Formula 1e

Formula 1f

Formula 1g

Formula 1h wherein the relative ratio of a:b:c:d is in the range 1~20 mol %:1~20 mol %:10~60 mol %:1~40 mol %; and the relative ratio of a:b:c:d:e is in the range 1~20 mol %:1~20 mol %:10~60 mol %:1~40 mol %:0~30 mol %.

A method for forming a photoresist polymer comprises:

(a) dissolving maleic anhydride, a compound of Formula 2, a compound of Formula 3, a compound of Formula 4 and optionally a compound of Formula 5 in a polymerization solvent;

(b) adding a polymerization initiator in the resulting solution of the step (a); and (c) reacting the resulting solution of the step (b) under a nitrogen or argon atmosphere to obtain a polymer having repeating unit of Formula 1 at a temperature ranging from 60 to 70° C. for 4 to 24 hours.

Formula 2

Formula 3

Formula 4

Formula 5 wherein $X_1$, $X_2$, $X_3$ and $X_4$ individually are selected from the group consisting of $CH_2$, $CH_2CH_2$, O and S;

$R_1$ and $R_2$ individually are selected from the group consisting of H, $CH_3$ and $CF_3$;

$R_3$ is selected from the group consisting of acid labile protecting group, $C_1$–$C_{20}$ alkyl and $C_1$–$C_{20}$ cycloalkyl;

$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether, $C_5$–$C_{10}$ alkyl including an ester group, $C_5$–$C_{10}$ cycloalkyl including an ether and $C_5$–$C_{10}$ cycloalkyl including an ester group;

$R_5$ is selected from the group consisting of H, $C_1$–$C_{20}$ alkyl, $C_1$–$C_{20}$ alkyl carboxylate and —O—$R_7$, wherein $R_7$ is $C_1$–$C_{20}$ cycloalkyl;

m is an integer ranging from 0 to 2; and n is an integer of 0 or 1.

The polymerization reaction which is radical polymerization is performed as types of bulk polymerization or solution polymerization. As disclosed in WO 96/37526 (Nov. 28, 1996), the polymerization may be performed using metal catalyst.

Preferably, the polymerization solvent of the step (a) is selected from the group consisting of cyclohexanone, cyclopentanone, tetrahydrofuran, dimethylformamide, dimethylsulfoxide, dioxane, methylethylketone, benzene, toluene, xylene and mixtures thereof.

Additionally, the polymerization initiator of the step (b) is preferably selected from the group consisting of benzoyl peroxide, 2,2'-azobisisobutyronitrile (AIBN), acetylperoxide, laurylperoxide, t-butylperacetate, t-butylhydroperoxide and di-t-butylperoxide.

The polymer obtained from the step (c) is preferably crystallized and purified using single or mixture solution selected from the group consisting of dimethylether, petroleum ether, methanol, ethanol, lower alcohol including isopropanol, and water.

In addition, a photoresist composition is disclosed that comprises the photoresist polymer of Formula 1, a photoacid generator and an organic solvent.

Any of conventional photoacid generators, which are able to generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Sulfide type or onium type compounds are primarily used for the photoacid generator.

More preferably, the photoacid generator is selected from the group consisting of phthalimidotrifluoromethane sulfonate, dinitrobenzyl-tosylate, n-decyl disulfone and naphthylimido trifluoromethane sulfonate having low absorbance at 157 nm and 193 nm. A lso, the photoacid generator may be further selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenyl-sulfonium triflate, diphenyl p-isobutylphenyl-sulfonium triflate, triphenylsulfonium hexafluoroarsenate, triphenylsulfonium hexafluoroantimonate, triphenyl-sulfonium triflate, and dibutyl-naphthylsulfonium triflate.

The photoacid generator is preferably present in an amount ranging from 0.05 to 10 wt % based upon the amount of the photoresist polymer present. If the photoresist generator is present in the amount of less than 0.05 wt %, it lowers photosensitivity of the photoresist composition to light. If the photoacid generator is present in the amount of more than 10 wt %, it results in a poor pattern formation due to its high absorption of far ultraviolet rays.

Any of the organic solvents can be used. Some of conventional organic solvents are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the organic solvent is selected from the group consisting of diethylene glycol diethyl ether, methyl 3-methoxypropionate, ethyl 3-ethoxypropionate, propylene glycol methyl ether acetate, cyclohexanone, 2-heptanone, and ethyl lactate.

The organic solvent is present in an amount ranging from 500 to 2000 wt % to the photoresist polymer in order to obtain a desired thickness of the photoresist film. For example, the thickness of the photoresist film is about 0.25 µm when the organic solvent is present in the amount of about 1000 wt % based upon the amount of the photoresist polymer present.

A method for forming a photoresist pattern comprises:
(a) coating the photoresist composition disclosed above on a wafer to form a photoresist film;
(b) exposing the photoresist film to light;
(c) baking the exposed photoresist film; and
(d) developing the photoresist film to obtain a photoresist pattern.

The above method may further comprise performing a bake process before exposure of the step (b). Here, the bake process is performed at a temperature ranging from 70 to 200° C.

The exposure process is performed using the light selected from the group consisting of KrF, ArF, EUV (Extreme Ultra Violet), VUV (Vacuum Ultra Violet), E-beam, X-ray and ion beam with exposure energy ranging from 0.1 to 100 mJ/cm$^2$.

The development of step (d) is preferably performed using an alkaline developing solution such as TMAH aqueous solution in an amount ranging from 0.01 to 5 wt %.

A semiconductor device manufactured according to the method described above is also disclosed.

The disclosed photoresist polymers and photoresist compositions containing the same will be described in greater detail by referring to examples below, which are not intended to be limiting.

I. Preparation of Photoresist Polymers

EXAMPLE 1

Synthesis of Compound of Formula 1b

To tetrahydrofuran (60 mL) were added the compound of Formula 2a (0.015 M) (CAS# 196314-61-1), maleic anhydride (0.015 M), 2-methyl-2-adamanthyl methacrylate (0.05 M), 2-hydroxyethyl methacrylate (0.02 M) (CAS# 868-77-9) and AIBN (0.2 g). The resulting mixture was reacted at 65° C. for 24 hours. After reaction the resulting mixture was distilled under reduced pressure. Then, polymers were precipitated in diethylether/hexane and filtered, thereby obtaining the polymer of Formula 1b (yield: 52%).

EXAMPLE 2

Synthesis of Compound of Formula 1c

To tetrahydrofuran (60 mL) were added the compound of Formula 2a (0.01 M), maleic anhydride (0.02 M), 2-methyl-2-adamanthyl methacrylate (0.05 M), 2-hydroxyethyl methacrylate (0.01 M), norbornylene (CAS# 498-66-8) and AIBN (0.2 g). The resulting mixture was reacted at 65° C. for 24 hours. After reaction the resulting mixture was distilled under reduced pressure. Then, polymers were precipitated in diethylether/hexane and filtered, thereby obtaining the polymer of Formula 1c (yield: 56%).

EXAMPLE 3

Synthesis of Compound of Formula 1d

To tetrahydrofuran (60 mL) were added the compound of Formula 2a (0.015 M), maleic anhydride (0.015 M), t-buthyl methacrylate (0.05 M) (CAS# 585-07-9), 2-hydroxyethyl methacrylate (0.02 M) and AIBN (0.2 g). The resulting mixture was reacted at 65° C. for 24 hours. After reaction the resulting mixture was distilled under reduced pressure. Then, polymers were precipitated in water/ethanol and filtered, thereby obtaining the polymer of Formula 1d (yield: 52%).

EXAMPLE 4

Synthesis of Compound of Formula 1e

To tetrahydrofuran (60 mL) were added the compound of Formula 2a (0.015 M), maleic anhydride (0.025 M), t-buthyl methacrylate (0.04 M), 2-hydroxymethyl methacrylate (0.01 M), norbornylene (0.01 M) and AIBN (0.2 g). The resulting mixture was reacted at 65° C. for 24 hours. After reaction the resulting mixture was distilled under reduced pressure. Then, polymers were precipitated in water/ethanol and filtered, thereby obtaining the polymer of Formula 1e (yield: 52%).

EXAMPLE 5

Synthesis of Compound of Formula 1f

To tetrahydrofuran (60 mL) were added the compound of Formula 2a (0.015 M), maleic anhydride (0.025 M), t-buthyl methacrylate (0.03 M), 2-hydroxymethyl methacrylate (0.02 M), t-buthyl-5-norbornene-2-carboxylate (0.01 M) (CAS# 154970-45-3) and AIBN (0.2 g). The resulting mixture was reacted at 65° C. for 24 hours. After reaction the resulting mixture was distilled under reduced pressure. Then, polymers were precipitated in water/ethanol and filtered, thereby obtaining the polymer of Formula 1f (yield: 52%).

EXAMPLE 6

Synthesis of Compound of Formula 1g

To tetrahydrofuran (60 mL) were added the compound of Formula 2a (0.015 M), maleic anhydride (0.025 M), 2-methyl-2-adamanthyl methacrylate (0.04 M), the compound of Formula 6 (0.01 M), norbornylene (0.01 M) and AIBN (0.2 μg). The resulting mixture was reacted at 65° C. for 24 hours. After reaction the resulting mixture was distilled under reduced pressure. Then, polymers were precipitated in water/ethanol and filtered, thereby obtaining the polymer of Formula 1g (yield: 58%).

Formula 6

EXAMPLE 7

Synthesis of Compound of Formula 1h

To tetrahydrofuran (60 mL) were added the compound of Formula 2a (0.015 M), maleic anhydride (0.025 M), 2-methyl-2-adamanthyl methacrylate (0.04M), the compound of Formula 6,2-methyl-2-adamanthyl-5-norbornene-2-carboxylate (0.01 M) and AIBN (0.2 g). The resulting mixture was reacted at 65° C. for 24 hours. After reaction the resulting mixture was distilled under reduced pressure. Then, polymers were precipitated in water/ethanol and filtered, thereby obtaining the polymer of Formula 1h (yield: 49%).

II. Preparation of Photoresist Compositions and Formation of Patterns

EXAMPLE 8

To propyleneglycolmethyl ether acetate (PGMEA) (20 g) were added the polymer (2 g) obtained from Example 1, phthalimidotrifluoromethane sulfonate (0.024 g) and triphenylsulfonium triflate (0.06 g) which are photoacid generators. The resulting mixture was filtered with a 0.20 μm filter, thereby obtaining a photoresist composition.

Figure 1:
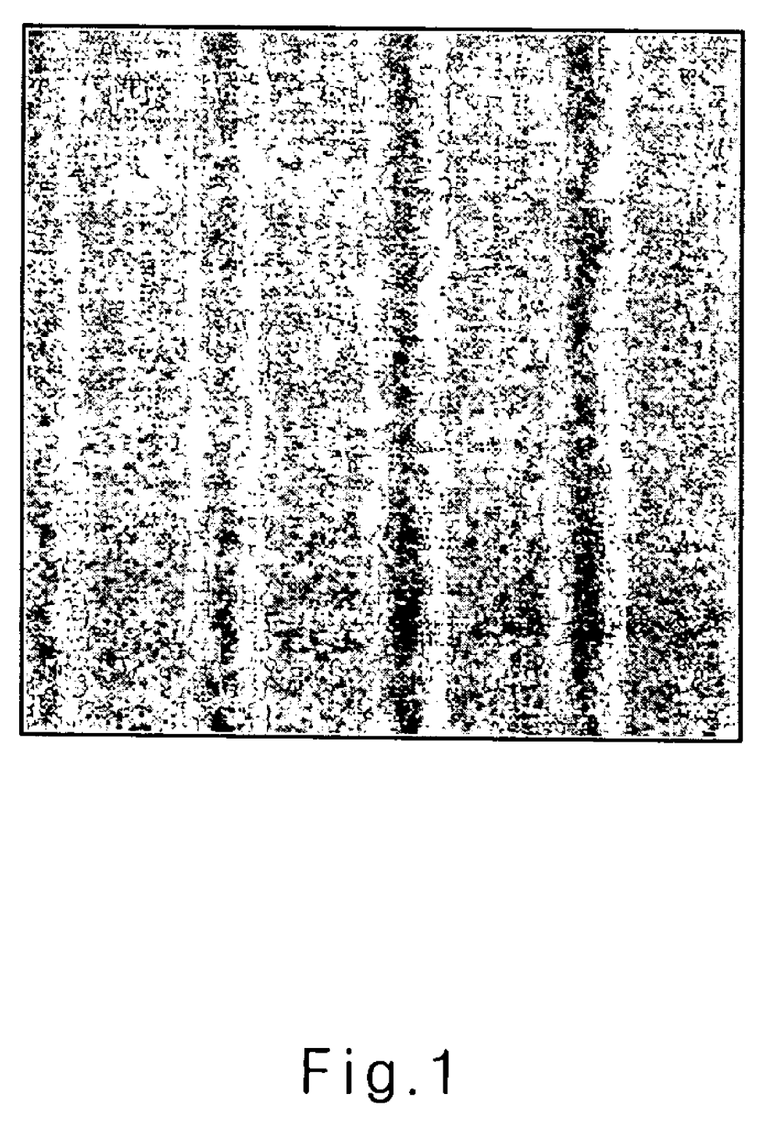
FIG. 1 is a photograph showing a photoresist pattern obtained from Example 8.

The photoresist composition was spin-coated on a silicon wafer to form a photoresist film, and soft-baked at 130° C. for 90 seconds. After baking, the photoresist was exposed to light using an ArF laser exposer, and then post-baked at 130° C. for 90 seconds. The baked wafer was developed in 2.38 wt % TMAH aqueous solution for 40 seconds to obtain 0.08 μm of L/S pattern (see FIG. 1).

EXAMPLE 9

Figure 2:
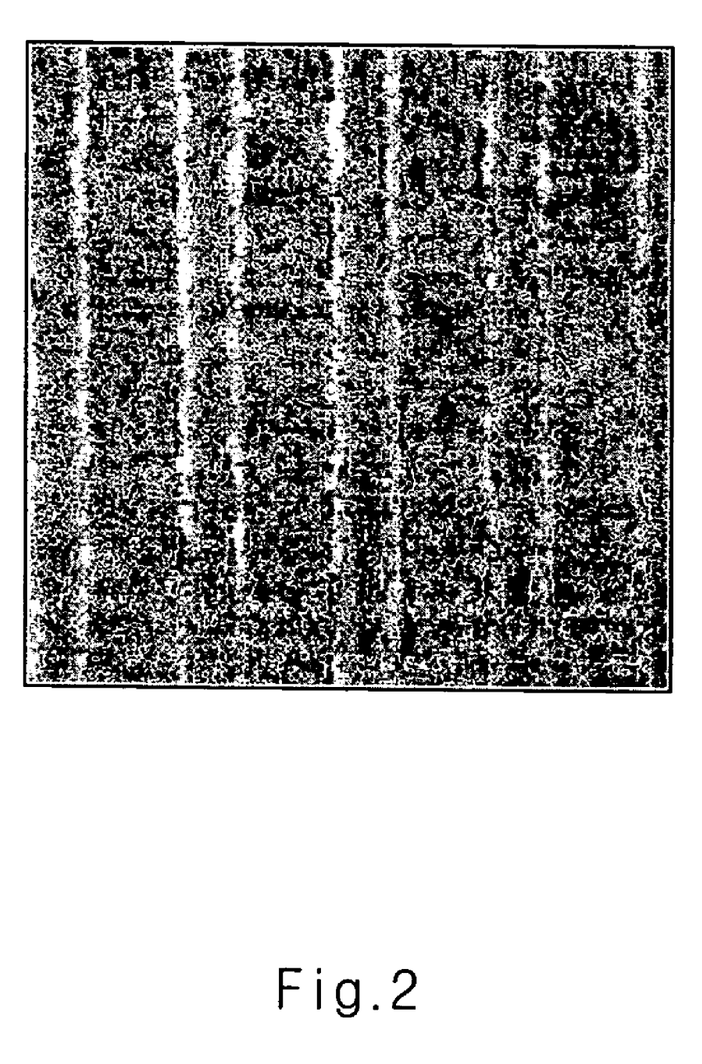
FIG. 2 is a photograph showing a photoresist pattern obtained from Example 9.

The procedure of Example 8 was repeated using the polymer (2 g) of Example 2 instead of the polymer of Example 1 to obtain the pattern of 0.08 μm of L/S pattern (see FIG. 2).

EXAMPLE 10

Figure 3:
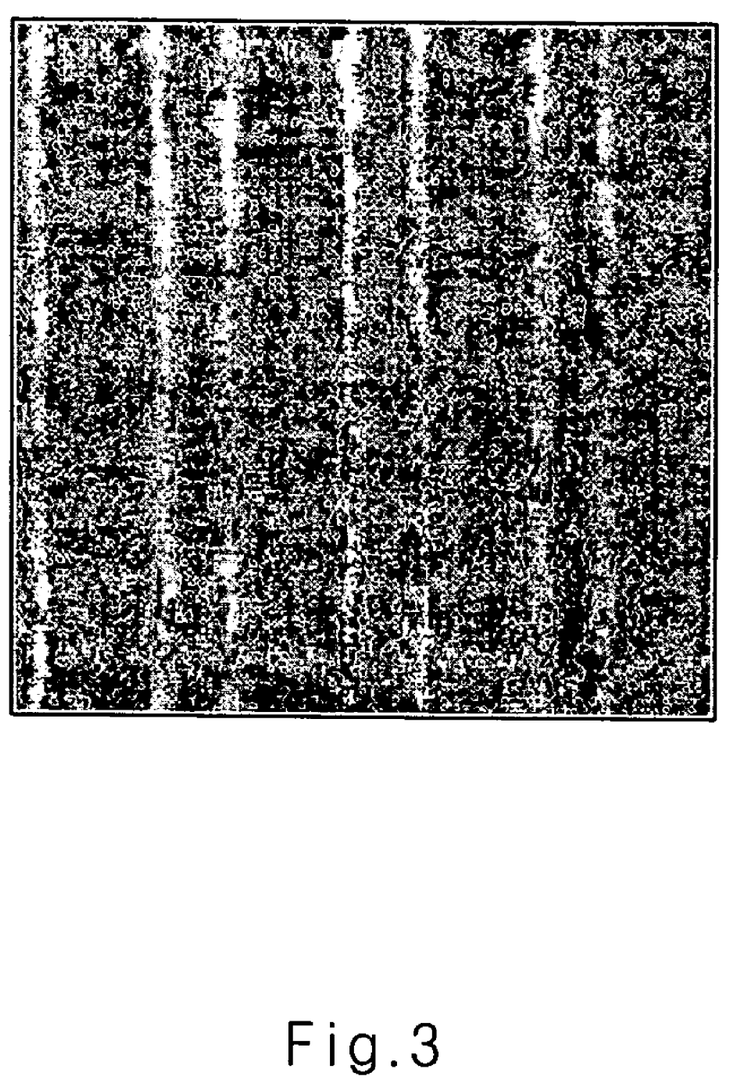
FIG. 3 is a photograph showing a photoresist pattern obtained from Example 10.

The procedure of Example 8 was repeated using the polymer (2 g) of Example 3 instead of the polymer of Example 1 to obtain the pattern of 0.08 μm of L/S pattern (see FIG. 3).

EXAMPLE 11

Figure 4:
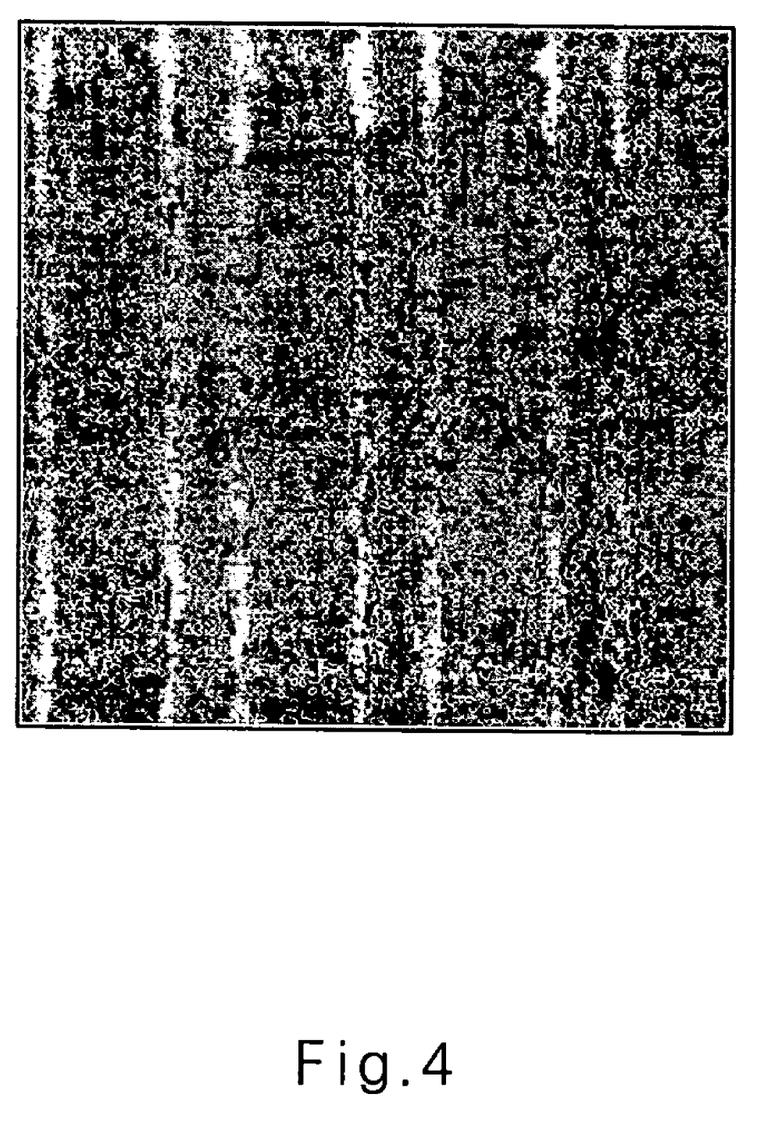
FIG. 4 is a photograph showing a photoresist pattern obtained from Example 11.

The procedure of Example 8 was repeated using the polymer (2 g) of Example 4 instead of the polymer of Example 1 to obtain the pattern of 0.08 μm of L/S pattern (see FIG. 4).

EXAMPLE 12

Figure 5:
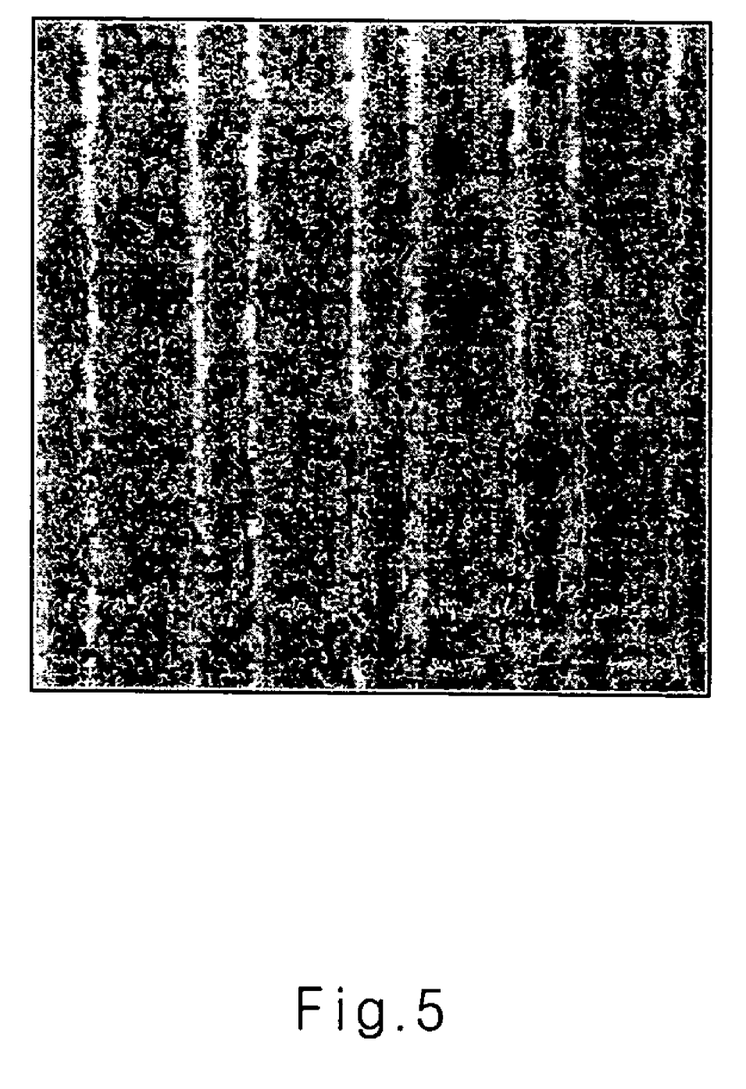
FIG. 5 is a photograph showing a photoresist pattern obtained from Example 12.

The procedure of Example 8 was repeated using the polymer (2 g) of Example 5 instead of the polymer of Example 1 to obtain the pattern of 0.08 μm of L/S pattern (see FIG. 5).

EXAMPLE 13

Figure 6:
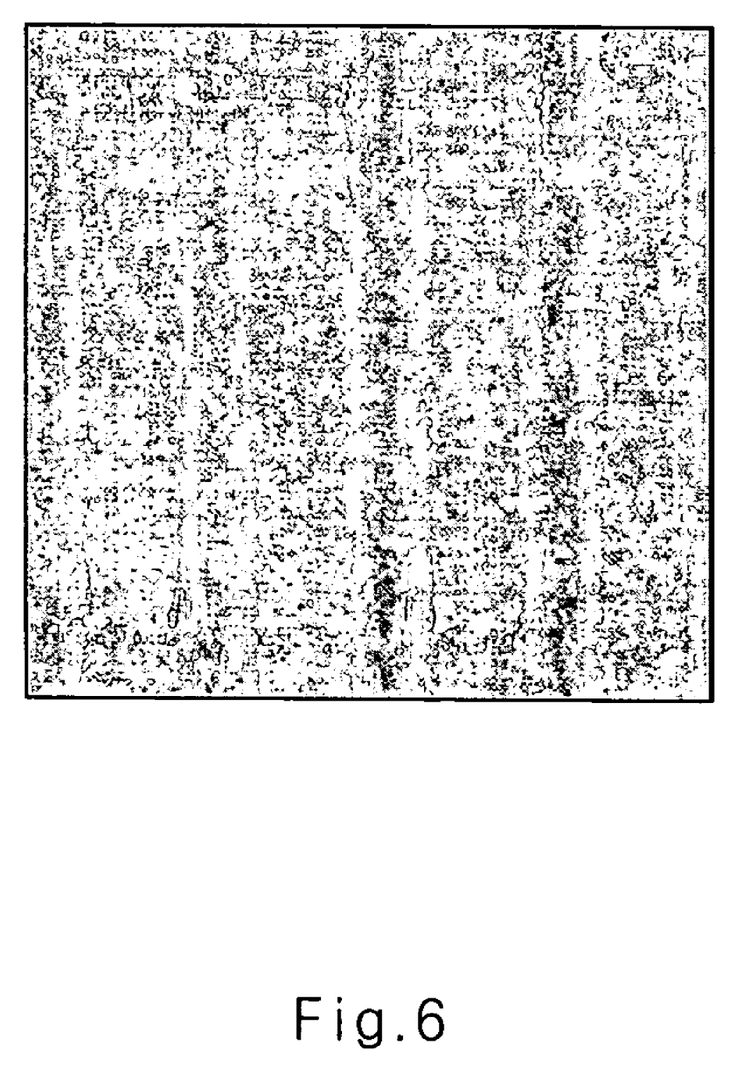
FIG. 6 is a photograph showing a photoresist pattern obtained from Example 13.

The procedure of Example 8 was repeated using the polymer (2 g) of Example 6 instead of the polymer of Example 1 to obtain the pattern of 0.08 μm of L/S pattern (see FIG. 6).

EXAMPLE 14

Figure 7:
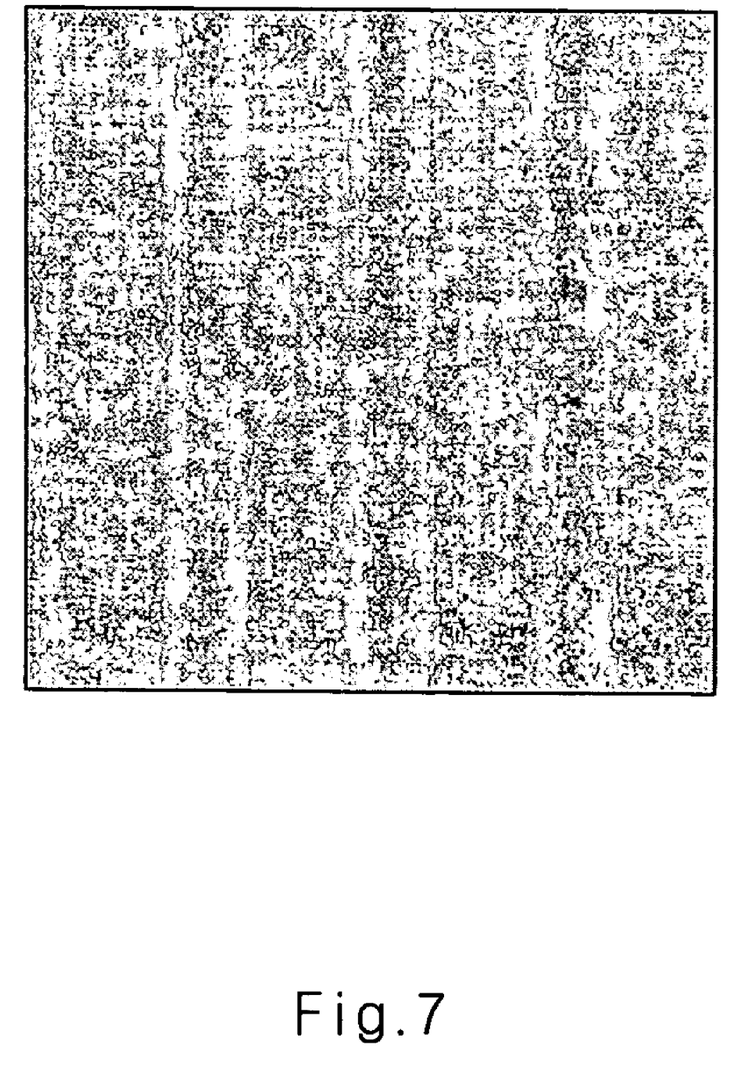
FIG. 7 is a photograph showing a photoresist pattern obtained from Example 14.

The procedure of Example 8 was repeated using the polymer (2 g) of Example 7 instead of the polymer of Example 1 to obtain the pattern of 0.08 μm of L/S pattern (see FIG. 7).

As discussed earlier, patterns having the improved LER can be obtained because the disclosed photoresist compositions including acidic alcohol groups have high affinity to basic developing solutions. Additionally, ultra microscopic patterns of 4 G, 16 G DRAMs as well as of less than 1 G DRAM can be obtained because the disclosed photoresist compositions containing polymers including fluorine have low absorbance at 193 nm and 157 nm.

What is claimed is:

1. A photoresist polymer comprising a repeating unit selected from the group consisting of Formulas 1b to 1h:

wherein
the relative ratio of a:b:c:d is in the range of 1~20 mol %:1~20 mol %:10~60 mol %:1~40 mol %; and
the relative ratio of a:b:c:d:e is in the range of 1~20 mol %:1~20 mol %:10~60 mol %:1~40 mol %:0~30 mol %.

2. A method for forming a photoresist polymer comprising (a) dissolving maleic anhydride, a compound of Formula 2a, a compound of Formula 3, a compound of Formula 4 and optionally a compound of Formula 5a in a polymerization solvent;

(b) adding a polymerization initiator in the resulting solution of step (a); and (c) reacting the resulting solution of step (b) under a nitrogen or argon atmosphere to obtain a polymer of claim 1 at a temperature ranging from 60 to 70° C. for 4 to 24 hours.

Formula 2a

Formula 3

Formula 4

Formula 5a wherein
R$_1$ and R$_2$ and CH$_3$;
R$_3$ is t-butyl or 2-methyl-2-adamantly;
R$_4$ is C$_1$–C$_2$ hydroxyalkyl or R$_5$ is H,t-butyl carboxylate or and
the relative ratio of a:b:c:d:e in the range of 1~20 mol %:1~20 mol %:10~60 mol %:1~40 mol %:0~30 mol %.

3. The method according to claim 2, wherein the polymerization solvent of step (a) is selected from the group consisting of cyclohexanone, cyclopentanone, tetrahydrofuran, dimethylformamide, dimethylsulfoxide, dioxane, methylethylketone, benzene, toluene, xylene and mixtures thereof.

4. The method according to claim 2, wherein the polymerization initiator of step (b) is selected from the group consisting of benzoylperoxide, 2,2'-azobisiso-butyronitrile (AIBN), acetylperoxide, laurylperoxide, t-butylperacetate, t-butylhydroperoxide and di-t-butylperoxide.

5. A photoresist composition comprising the photoresist polymer of claim 1, a photoacid generator and an organic solvent.

6. The method according to claim 2, wherein the polymer obtained from step (c) is crystallized and purified using single or mixture solution selected from the group consisting of dimethylether, petroleum ether, methanol, ethanol, lower alcohol including iso-propanol, and water.

7. The photoresist composition according to claim 5, wherein the photoacid generator is selected from the group consisting of phthalimidotrifluoromethane sulfonate, dinitrobenzyltosylate, n-decyl disulfone and naphthylimido trifluoromethane sulfonate.

8. The photoresist composition according to claim 5, wherein the photoacid generator comprises
(i) a first photoacid generator is selected from the group consisting of phthalimidotrifluoromethane sulfonate, dinitrobenzyltosylate, n-decyl disulfone and naphthylimido trifluoromethane sulfonate; and
(ii) a second photoacid generator is selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluororarsenate, triphenylsulfonium hexafluoro-antimonate, triphenylsulfonium triflate, and dibutyl-naphthylsulfonium triflate.

9. The photoresist composition according to claim 5, wherein the photoacid generator is present in an amount ranging from 0.05 to 10 wt % to the photoresist polymer.

10. The photoresist composition according to claim 5, wherein the organic solvent is selected from the group consisting of diethylene glycol diethyl ether, methyl 3-methoxypropionate, ethyl 3-ethoxypropionate, propylene glycol methyl ether acetate, cyclohexanone, 2-heptanone, and ethyl lactate.

11. The photoresist composition according to claim 5, wherein the organic solvent is present in an amount ranging from 500 to 2000 wt % to the photoresist polymer.

12. A method for forming a photoresist pattern, comprising the step of:
(a) coating the photoresist composition of claim 5 on a wafer to form a photoresist film;
(b) exposing the photoresist film to light;
(c) baking the exposed photoresist film; and
(d) developing the photoresist film to obtain a photoresist pattern.

13. The method according to claim 12, further comprising performing a bake process before exposure of step (b).

14. The method according to claim 12, wherein the bake process is performed at a temperature ranging from 70 to 200° C.

15. The method according to claim 12, wherein the light is selected from the group consisting of KrF, ArF, EUV (Extreme Ultra Violet), VUV (Vacuum Ultra Violet), E-beam, X-ray and ion beam.

16. The method according to claim 12, wherein the exposure process is performed with exposure energy ranging from 0.1 to 100 mJ/cm$^2$.

17. The method according to claim 12, wherein the development of step (d) is performed using an alkaline developing solution.

18. A photoresist composition comprising:
a photoresist polymer comprising a repeating unit represented by Formula 1, a photoacid generator and an organic solvent,

Formula 1 wherein
$X_1$, $X_2$, $X_3$ and $X_4$ individually are selected from the group consisting of $CH_2$, $CH_2CH_2$, O and S;
$R_1$ and $R_2$ individually are selected from the group consisting of H, $CH_3$ and $CF_3$;
$R_3$ is selected from the group consisting of an acid labile protecting group, $C_1$–$C_{20}$ alkyl and $C_1$–$C_{20}$ cycloalkyl;
$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether group, $C_5$–$C_{10}$ alkyl including an ester group, $C_5$–$C_{10}$ cycloalkyl including an ether group, and a $C_5$–$C_{10}$ cycloalkyl including an ester group;
$R_5$ is selected from the group consisting of H, $C_1$–$C_{20}$ alkyl, $C_1$–$C_{20}$ alkyl carboxylate, and —O—$R_7$, wherein $R_7$ is $C_1$–$C_{20}$ cycloalkyl;
m is an integer ranging from 0 to 2;
n is an integer of 0 or 1; and
the relative ratio of a:b:c:d: e is in the range of 1~20 mol %:1~20 mol %:10~60 mol %:1~40 mol %:0~30 mol %; and
wherein the photoacid generator selected from the group consisting of phthalimidotrifluoromethane sulfonate, dinitrobeuzyltosylate, n-decyl disulfone and naphthylimido trifluoromethane sulfonate.

19. A photoresist composition comprising:
a photoresist polymer comprising a repeating unit represented by Formula 1, a photoacid generator and an organic solvent,

Formula 1 wherein
$X_1$, $X_2$, $X_3$ and $X_4$ individually are selected from the group consisting of $CH_2$, $CH_2CH_2$, O and S;
$R_1$ and $R_2$ individually are selected from the group consisting of H, $CH_3$ and $CF_3$;
$R_3$ is selected from the group consisting of an acid labile protecting group, $C_1$–$C_{20}$ alkyl and $C_1$–$C_{20}$ cycloalkyl;
$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether group, $C_5$–$C_{10}$ alkyl including an ester group, $C_5$–$C_{10}$ cycloalkyl including an ether group, and a $C_5$–$C_{10}$ cycloalkyl including an ester group;
$R_5$ is selected from the group consisting of H, $C_1$–$C_{20}$ alkyl, $C_1$–$C_{20}$ alkyl carboxylate, and —O—$R_7$, wherein $R_7$ is $C_1$–$C_{20}$ cycloalkyl;
m is an integer ranging from 0 to 2;
n is an integer of 0 or 1; and
the relative ratio of a:b:c:d:e is in the range of 1~20 mol %:1~20 mol %:10~60 mol %:1~40 mol %:0~30 mol %; and
wherein the photoacid generator comprises
(i) a first photoacid generator is selected from the group consisting of phthalimidotrifluoromethane sulfonate, dinitrobenzyltosylate, n-decyl disulfone and naphthylimido trifluoromethane sulfonate; and
(ii) a second photoacid generator is selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluororarsenate, triphenylsulfonium hexafluoro-antimonate, triphenylsulfonium triflate, and dibutyl-naphthylsulfonium triflate.

20. A method for forming a photoresist pattern, comprising:
(a) coating a photoresist composition on a wafer to form a photoresist film, the photoresist composition comprising a photoresist polymer, a photoacid generator and an organic solvent, the photoresist polymer comprising a repeating unit of the following Formula 1 wherein
$X_1$, $X_2$, $X_3$ and $X_4$ individually are selected from the group consisting of $CH_2$, $CH_2CH_2$, O and S;
$R_1$ and $R_2$ individually are selected from the group consisting of H, $CH_3$ and $CF_3$;
$R_3$ is selected from the group consisting of an acid labile protecting group, $C_1$–$C_{20}$ alkyl and $C_1$–$C_{20}$ cycloalkyl;

$R_4$ is selected from the group consisting of $C_1$–$C_{20}$ hydroxyalkyl, $C_1$–$C_{20}$ hydroxyalkyl having halogen substituent, $C_5$–$C_{10}$ alkyl including an ether group, $C_5$–$C_{10}$ alkyl including an ester group, $C_5$–$C_{10}$ cycloalkyl including an ether group, and a $C_5$–$C_{10}$ cycloalkyl including an ester group;

$R_5$ is selected from the group consisting of H, $C_1$–$C_{20}$ alkyl, $C_1$–$C_{20}$ alkyl carboxylate, and —O—$R_7$, wherein $R_7$ is $C_1$–$C_{20}$ cycloalkyl;

m is an integer ranging from 0 to 2;

n is an integer of 0 or 1; and the relative ratio of a:b:c:d:e is in the range of 1~20 mol %:1~20 mol %:10~60 mol %:1~40 mol %:0~30 mol %;

(b) exposing the photoresist film to light with an exposure energy ranging from 0.1 to 100 $mJ/cm^2$;

(c) baking the exposed photoresist film; and (d) developing the photoresist film to obtain a photoresist pattern.

* * * * *

UNITED STATES PATENT AND TRADEMARK OFFICE
CERTIFICATE OF CORRECTION

PATENT NO.         : 7,022,458 B2                                    Page 1 of 1
APPLICATION NO. : 10/719905
DATED              : April 4, 2006
INVENTOR(S)        : Geun Su Lee et al.

It is certified that error appears in the above-identified patent and that said Letters Patent is hereby corrected as shown below:

In the Claims:

At Column 13, line 7, "$(CH_2)_m$" in formula 2a should be -- $CH_2$ --.

At Column 13, line 36, "2-methyl-adamantly" should be -- 2-methyl-adamantyl --.

Signed and Sealed this

Twenty-third Day of January, 2007

JON W. DUDAS
*Director of the United States Patent and Trademark Office*